(12) United States Patent
Kronberger

(10) Patent No.: US 7,851,979 B2
(45) Date of Patent: Dec. 14, 2010

(54) PIEZOCERAMIC MULTILAYER ACTUATOR, METHOD FOR PRODUCING A PIEZOCERAMIC MULTILAYER ACTUATOR, AND INJECTION SYSTEM

(75) Inventor: Maximilian Kronberger, Steyr (AT)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 12/278,729

(22) PCT Filed: Jan. 9, 2007

(86) PCT No.: PCT/EP2007/050160
§ 371 (c)(1), (2), (4) Date: Aug. 7, 2008

(87) PCT Pub. No.: WO2007/090698
PCT Pub. Date: Aug. 16, 2007

(65) Prior Publication Data
US 2009/0000597 A1    Jan. 1, 2009

(30) Foreign Application Priority Data
Feb. 9, 2006    (DE) ............ 10 2006 006 077

(51) Int. Cl.
*H01L 41/08*    (2006.01)
(52) U.S. Cl. .................. 310/366; 310/328
(58) Field of Classification Search .......... 310/328
See application file for complete search history.

(56) References Cited

U.S. PATENT DOCUMENTS

| | | | |
|---|---|---|---|
| 6,411,018 B1* | 6/2002 | Heinz ............... | 310/363 |
| 6,452,308 B1 | 9/2002 | Heinz et al. | |
| 6,522,052 B2 | 2/2003 | Isioka et al. | |
| 6,573,639 B1* | 6/2003 | Heinz et al. ............ | 310/363 |
| 6,731,048 B2 | 5/2004 | Kawazoe | |
| 7,259,504 B2 | 8/2007 | Schuerz et al. | |
| 7,276,841 B2* | 10/2007 | Takaoka et al. ......... | 310/363 |
| 7,420,316 B2 | 9/2008 | Kienzler et al. | |
| 7,439,655 B2* | 10/2008 | Asano et al. ............ | 310/328 |
| 7,538,475 B2* | 5/2009 | Ohmori et al. .......... | 310/328 |
| 7,612,487 B2* | 11/2009 | Dollgast et al. ......... | 310/328 |
| 2002/0043901 A1 | 4/2002 | Isioka et al. | |
| 2002/0084723 A1 | 7/2002 | Kawazoe | |
| 2006/0066182 A1 | 3/2006 | Schuerz et al. | |

(Continued)

FOREIGN PATENT DOCUMENTS

DE    19856185 A1    6/2000

(Continued)

OTHER PUBLICATIONS

Chinese Office Action for Application No. 200780004762.7 (4 pages), Nov. 26, 2009.

(Continued)

*Primary Examiner*—Mark Budd
(74) *Attorney, Agent, or Firm*—King & Spalding L.L.P.

(57) ABSTRACT

A piezoceramic multilayer actuator has at least one outer electrode which can expand and provides at least two current paths between a supply potential connecting area of the outer electrode and a respective inner electrode, with which the outer electrode makes contact, of a piezo-stack of the multilayer actuator.

14 Claims, 8 Drawing Sheets

U.S. PATENT DOCUMENTS

| | | | |
|---|---|---|---|
| 2006/0113870 A1* | 6/2006 | Kienzler et al. | 310/328 |
| 2007/0040480 A1* | 2/2007 | Schurz et al. | 310/366 |

FOREIGN PATENT DOCUMENTS

| | | |
|---|---|---|
| DE | 19928189 | 4/2001 |
| DE | 19928189 A1 | 4/2001 |
| DE | 10164171 A1 | 7/2002 |
| DE | 10163358 A1 | 8/2002 |
| DE | 10139550 A1 | 3/2003 |
| DE | 10234787 C1 | 10/2003 |
| DE | 102004005227 | 2/2004 |
| DE | 10319600 A1 | 11/2004 |
| DE | 10341333 A1 | 4/2005 |
| DE | 10241992 B4 | 5/2005 |
| DE | 102004002484 A1 | 8/2005 |
| DE | 102004005227 A1 | 8/2005 |
| EP | 1577960 A1 | 9/2005 |
| WO | WO 02061856 A1 | 8/2002 |
| WO | 2005027235 | 3/2005 |
| WO | 2005074050 | 8/2005 |

OTHER PUBLICATIONS

German Office Action, German application No. 10 2006 006 077.6-42, 2 pages. Nov. 11, 2006.
International Search Report and Written Opinion; PCT/EP2007/050160; pp. 10, Jun. 4, 2007.

* cited by examiner

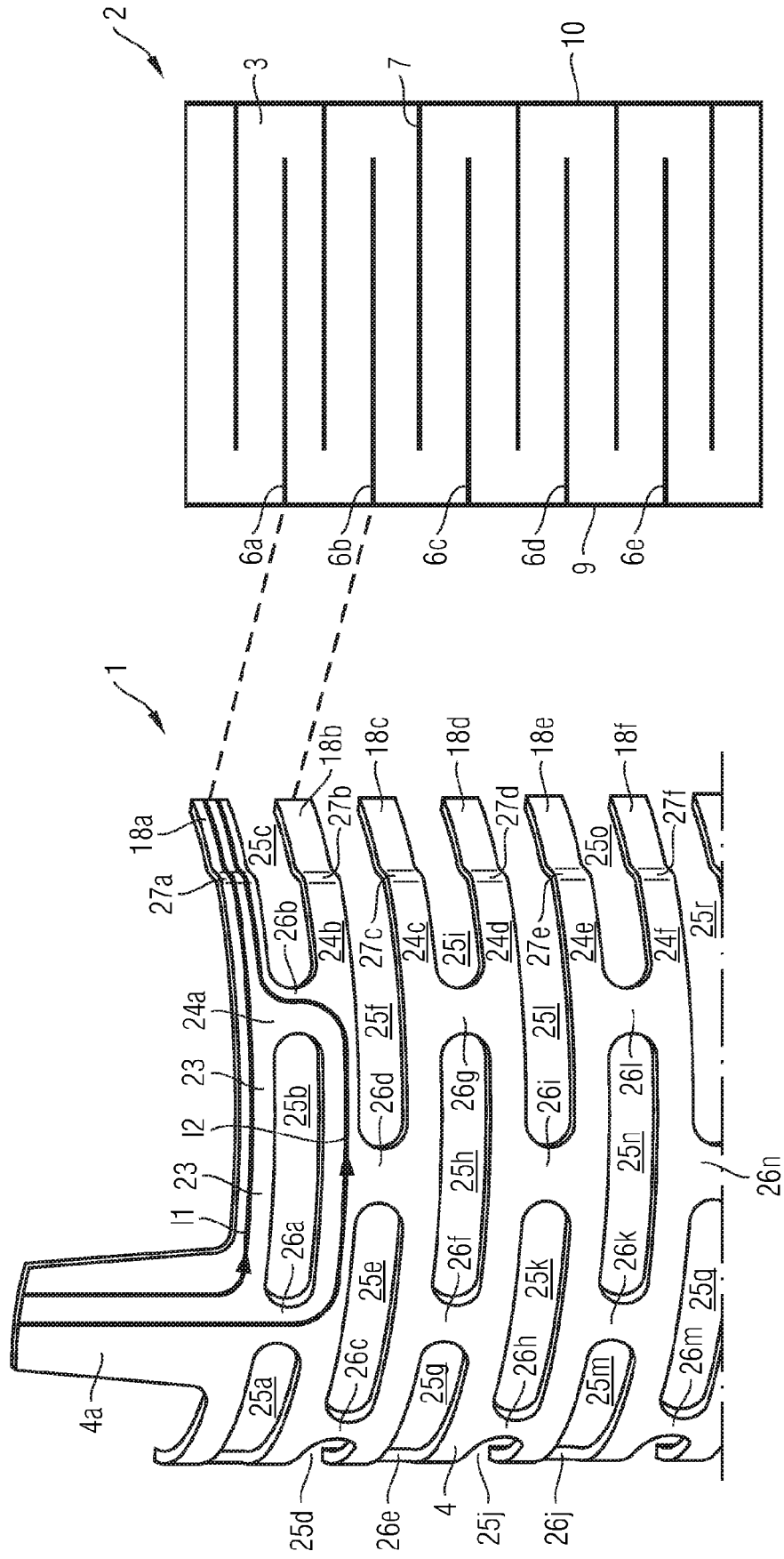

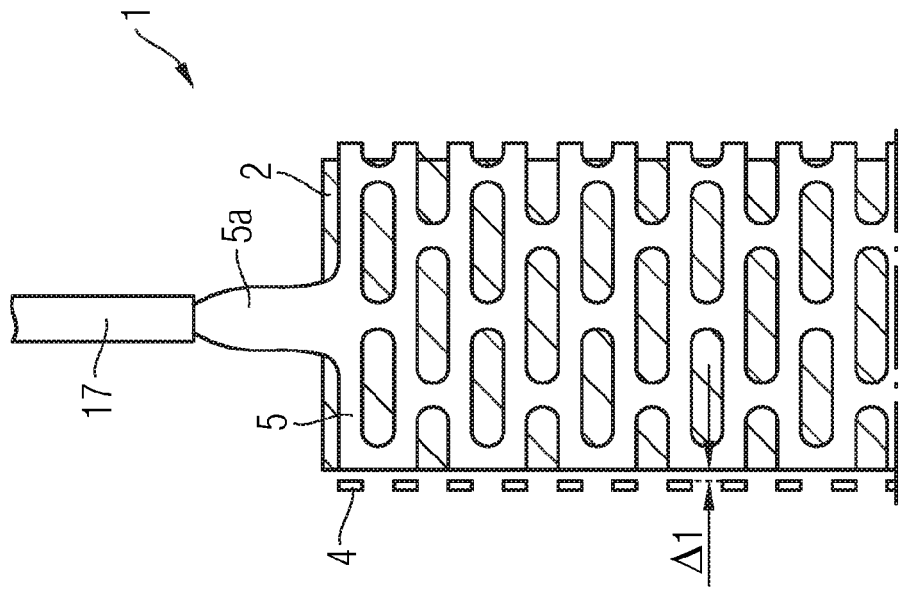
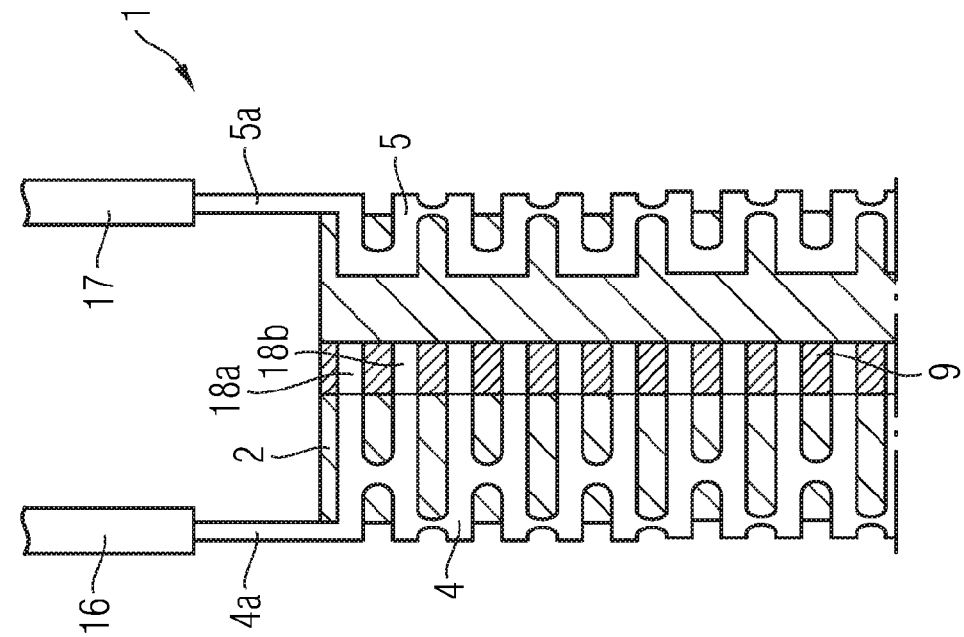

FIG 9A
FIG 9B
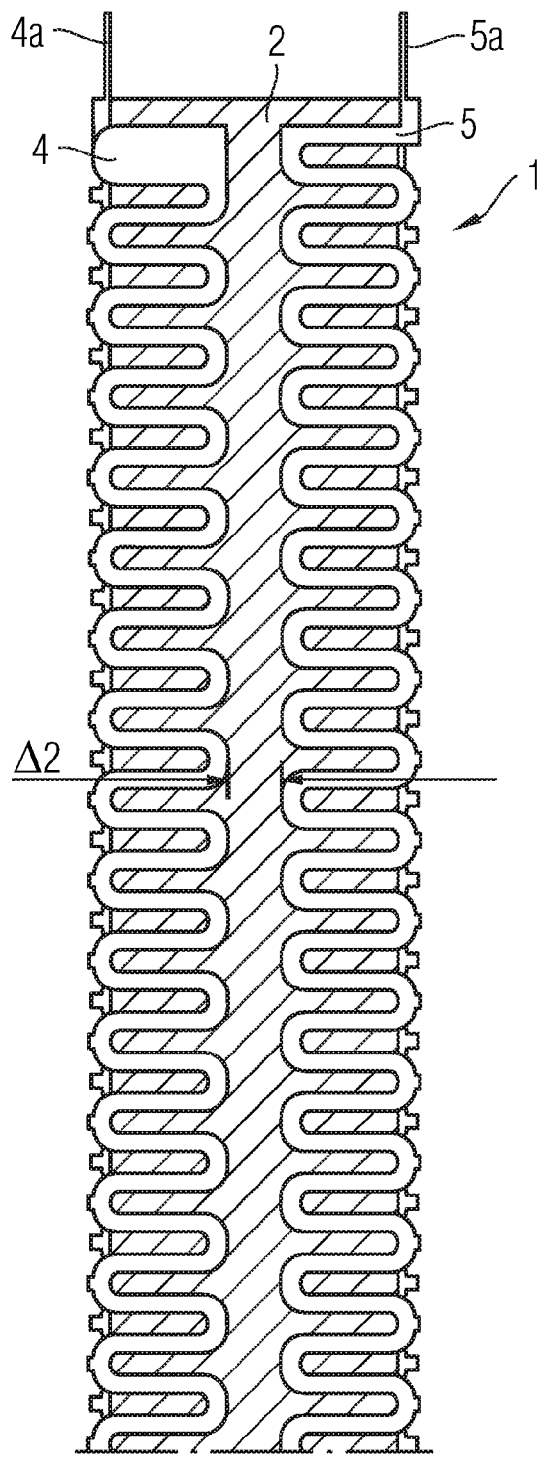
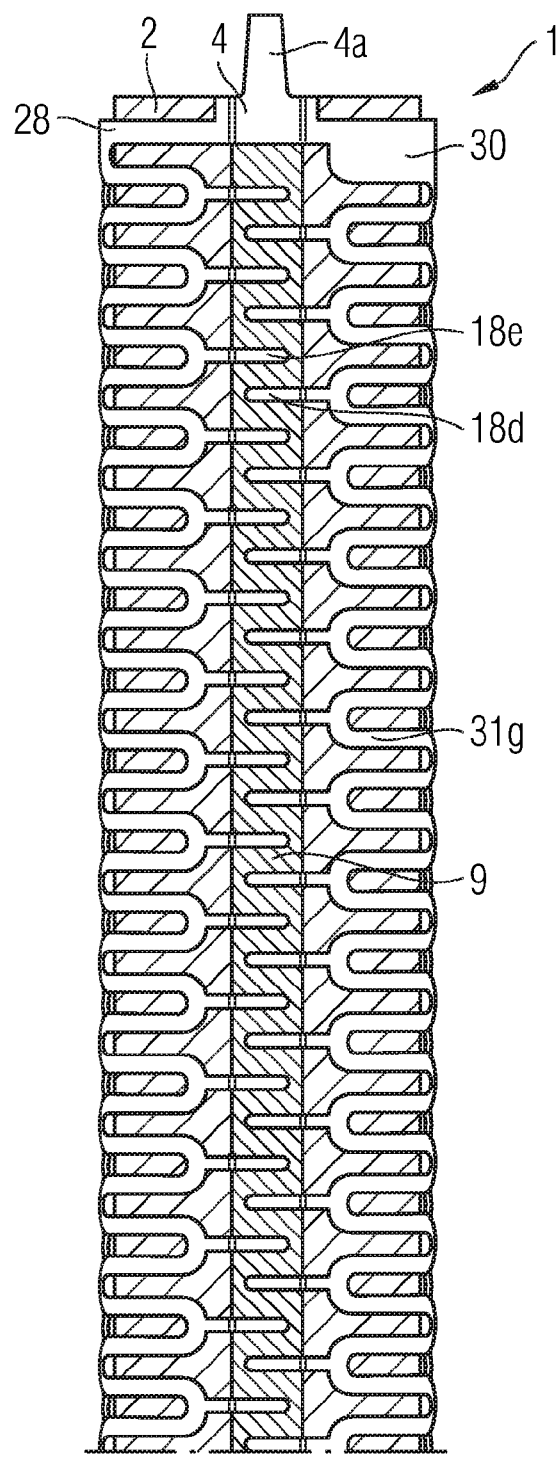

PIEZOCERAMIC MULTILAYER ACTUATOR, METHOD FOR PRODUCING A PIEZOCERAMIC MULTILAYER ACTUATOR, AND INJECTION SYSTEM

CROSS-REFERENCE TO RELATED APPLICATIONS

This application is a U.S. national stage application of International Application No. PCT/EP2007/050160 filed Jan. 9, 2007, which designates the United States of America, and claims priority to German application number 10 2006 006 077.6 filed Feb. 9, 2006, the contents of which are hereby incorporated by reference in their entirety.

TECHNICAL FIELD

The invention relates to a piezoceramic multilayer actuator, a method for producing a piezoceramic multilayer actuator and an injection system with a piezoceramic multilayer actuator.

BACKGROUND

Injection systems and in particular oil leakage free common rail injection systems require a control element such as for example a piezoactuator or a piezoceramic multilayer actuator in the high pressure area. In order to ensure the piezoactuator's capacity to work even under high pressures exceeding 2000 bar, the pressure must also be able to act in a lateral manner on the piezo-stack or the piezoceramic body in order to support the expansion capacity of the piezo-stack of the piezoactuator.

Such a piezoactuator is for example described in WO 02/061856 A1. In this patent, the ceramic body of this piezoactuator is enveloped in a polymer sleeve or a plastic sleeve. However, hermetic sealing of the ceramic body against fuel under a high fuel pressure such as for example 2000 bar in the case of the plastics known up to the application date of this patent application is hardly feasible or not feasible at all. Because of an electrical conductivity of commercial fuels in some cases, for example due to a slight acid content, even a slight wetting of the piezoceramics can result in voltage flashovers between the inner electrodes of the piezoactuator. In addition to this, high expansions of the plastic sleeve occur at the polarity cracks, which aggravate this problem. In addition, in WO 02/061856 the use of a filler material between the piezo-stack and the polymer sleeve or plastic sleeve is described. However, in the case of the described filler material, the problem exists that, in the case of an expansion of the piezo-stack, it may flow into developing spaces or joints, and can be destroyed in the case of a movement of the piezo-stack in the opposite direction. In this way, the filler material is consumed or destroyed over the service life of the piezo actuator. However, the reduced filler material naturally determines that the pressure from the outside on the piezoactuator can no longer be transmitted efficiently to the piezo-stack.

In addition, a solution for the transmission of the pressure to the piezo-stack of the piezoactuator with a hermetically sealed metal sheath is known, which transmits the hydraulic forces by means of a filler material, for example of plastic, to the side surfaces of the piezoceramic body. However, this solution well known to the applicant has the disadvantage that the thermal expansion coefficients of plastics exceed those of the piezoceramics by orders of magnitude, which consequently require volume equalization for example by means of air or gas-filled cavities. However, these required cavities considerably reduce the laterally transmittable forces to the piezoceramics or the piezo-stack so that support for the longitudinal expansion of the piezo-stack is significantly reduced.

In addition, in this known solution there exists the problem of the increased space requirement need for the actuator. Because of the high thermal expansion coefficients of plastics compared with the metal sheath, the filler material may not exceed a certain volume since otherwise the maximum yieldable stress amplitudes of the metal sheath would be exceeded with the extreme combinations arising from temperature and pressure during the operation. Where the cavities between the sheath and the piezo-stack are filled as described above, the necessary volume minimization for a compact and space-saving construction of the multilayer-actuator is difficult or impossible because a comparatively large distance must be selected between the inner diameter of the metal sheath and the outer contacting of the piezo-stack in order to guarantee a sufficient passivation thickness everywhere in the case of the given production-related shape inaccuracies as well as the operation-relation deformations of the piezo-stack and the metal sheath.

Furthermore, contacting of the piezo-stack with a compact design is known, which consists of a metal pin of approximately 1 mm diameter for the respective plus and the minus poles, which in each case is connected electrically conductively by means of about 60 wires to the outer metallization of the piezo-stack. These pins preferably extend over the entire length of the piezo-stack. In this process, the wires are fixed equally spaced to the pin and the outer metallization of the piezo-stack so that with an interruption in the metallization or a wire, a maximum of 1/60 of the electrical capacity of the piezo-stack is lost. However, this solution is not suitable to the effect that the contacting, in particular the pins for the movements of the plus and the minus poles take part in particular expansions of the piezo-stack. In addition, bringing about contact by means of metal pins and associated wires for contacting the metallization of the piezo-stack is expensive. Furthermore, the current carrying capacity of the outer contacting or the outer electrode of the piezo-stack consisting of pins and wires is low. This, in particular in the case of local short circuits, leads to problems which can lead to the destruction of the multilayer actuator.

SUMMARY

A piezoceramic multilayer actuator, in particular a compact piezoceramic multilayer-actuator can be provided that is as compact as possible in which an electrical interruption of an outer electrode of the multilayer actuator does not lead to any loss or to a minimal loss in operable piezo layers. Also, a piezoceramic multilayer actuator, in particular a compact piezoceramic multilayer actuator can be produced which is as compact as possible with a high current carrying capacity in which an electrical interruption of an outer electrode of the multilayer actuator does not lead to any loss or to a minimal loss in operable piezo layers.

A piezoceramic multilayer actuator can be provided in which a pressure applied on the outside of the multilayer actuator is transmitted to the piezo-stack of the multilayer actuator as efficiently as possible and in particular is distributed.

Furthermore, a multilayer actuator can be produced which in particular is also protected against voltage flashovers in a high-pressure environment, for example even above 2000 bar.

According to an embodiment, a piezoceramic multilayer actuator may comprise a piezo-stack, which has a plurality N of piezo layers having at least one expandable outer electrode which provides at least two current paths between a supply potential connecting area of the outer electrode and a respective inner electrode of the piezo-stack with which the outer electrode makes contact.

According to a further embodiment, the piezo-stack may have a circular cylindrical shape. According to a further embodiment, the outer electrode essentially may have a flat shape adapted to a peripheral surface of the piezo-stack and at least partly surrounds the piezo-stack. According to a further embodiment, the outer electrode may be essentially embodied as a flat expanded metal or a perforated sheet or a wire mesh for example of Invar or bourdon tube adapted to the peripheral surface of the piezo-stack. According to a further embodiment, the outer electrode may span an area ranging from 30% to 50% or from 40% to 49%, or from 45% to 49% of half the circumference of the piezo-stack. According to a further embodiment, the piezo-stack may have a plurality N of first inner electrodes and a plurality N of second inner electrodes, with a piezo layer being arranged between a first inner electrode and a second inner electrode and the plurality N of first inner electrodes being electrically coupled to a first outer electrode and the plurality N of second inner electrodes to a second outer electrode. According to a further embodiment, the first outer electrode and the second outer electrode may essentially span the piezo-stack, with the first outer electrode being connected to a first metallization, which electrically contacts the N first inner electrodes and the second outer electrode to a second metallization, which electrically contacts the N second inner electrodes. According to a further embodiment, the outer electrode may comprise: the supply potential connecting area; a plurality of N fingers, which are electronically contacted parallel to the metallization in the area of an inner electrode in each case; a plurality N of contact links arranged in parallel in the axial direction of the piezo-stack, which span the piezo-stack in the circumferential direction and feature a first distance to the piezo-stack, with two adjacent contact links in each case being separated from each other by means of at least one slot arranged in the circumferential direction in order to increase the expansion capacity of the outer electrode and being connected to each other by means of at least one bridge section arranged in the longitudinal direction of the piezo-stack for conveying the current; and a plurality N of connecting sections arranged in the transverse direction of the piezo-stack, with one connecting section in each case electrically connecting one specific finger to the corresponding contact link. According to a further embodiment, the outer electrode may comprise: the supply potential connecting area; a first serpentine section arranged in a longitudinal direction of the piezo-stack, which is electrically coupled to the supply potential connecting area and which features a plurality N/2 of first curve sections; a second serpentine section arranged in parallel to the first serpentine section, which is electrically coupled to the supply potential connecting area and which features a plurality N/2 of second curve sections; and a plurality of N fingers, which are electrically contacted in parallel to the metallization in each case in the area of an inner electrode and which are electrically coupled in an alternating manner to the first serpentine section or to the second serpentine section. According to a further embodiment, each (2n)th finger, with n∈ [1, ... , N], is connected to the specific first curve section and each (2n+1)th finger to the specific second curve section. According to a further embodiment, each finger in the area of a vertex of the corresponding curve section is connected to the corresponding curve section. According to a further embodiment, the first outer electrode with the first metallization may be connected by means of a welded joint or by means of at least one bonding wire. According to a further embodiment, the second outer electrode with the second metallization may be connected by means of a welded joint or by means of at least one bonding wire. According to a further embodiment, the first outer electrode and the first metallization or the second outer electrode and the second metallization may be embodied as a single piece. According to a further embodiment, the piezo-stack may have a first recess in the peripheral surface of the piezo-stack in which the first metallization is arranged or has a second recess in the peripheral surface of the piezo-stack in which the second metallization is arranged. According to a further embodiment, the first recess may be so deep that the first metallization runs in such a way within the space determined by the radius of the cylindrical piezo-stack or the second recess that the second metallization runs within the space determined by the radius of the cylindrical piezo-stack. According to a further embodiment, provision may be made for a sleeve which encloses at least the piezo-stack, the first outer electrode, and the second outer electrode. According to a further embodiment, the first outer electrode and the second outer electrode can be suited for transmitting a pressure applied on the outside to the sleeve of the piezo-stack. According to a further embodiment, the sleeve may be embodied as a corrugated tube which has a plurality of M corrugations and is in particular metallic. According to a further embodiment, provision may be made for a first passivation layer between the piezo-stack and the outer electrodes and a second passivation layer between the outer electrodes and the sleeve. According to a further embodiment, the first passivation layer or the second passivation layer essentially may consist of an elastomer or Teflon or a gel. According to a further embodiment, the first passivation layer or the second passivation layer may have a Shore A hardness of at least 70. According to a further embodiment, provision may be made for at least one O-ring shaped supporting element in at least one corrugation of the corrugated tube, which consists of an elastomer or Teflon. According to a further embodiment, the corrugated tube can be embodied as a longitudinal corrugated tube or a corrugated tube which can expand in a transverse direction. According to a further embodiment, the multilayer actuator may have a circular cylindrical shape. According to a further embodiment, provision may be made for a connection, which contacts the supply potential connecting area of the outer electrode for supplying the corresponding inner electrode with a supply potential. According to a further embodiment, the slots adjacent to one another in the longitudinal direction can be arranged offset from one another in the circumferential direction in a preferred manner.

According to another embodiment, a method for producing a piezoceramic multilayer actuator may comprise the steps of: (a) providing a piezo-stack which has a plurality N of piezo layers; and (b) arranging at least one outer electrode which can expand on the piezo-stack in such a way that at least two current paths are provided between a supply potential connecting area of the outer electrode and a respective inner electrode, with which the outer electrode makes contact, of the piezo-stack.

According to yet another embodiment, an injection system may comprise a piezoceramic multilayer actuator with a piezo-stack, which has a plurality N of piezo layers having at least one expandable outer electrode which provides at least two current paths between a supply potential connecting area of the outer electrode and a respective inner electrode of the piezo-stack with which the outer electrode makes contact, wherein the multilayer actuator is arranged in a high-pressure space of the injection system.

According to a further embodiment, the injection system can be embodied as a common rail injection system.

BRIEF DESCRIPTION OF DRAWINGS

The invention is described in more detail below with reference to the exemplary embodiments specified in the schematic figures of the drawing, in which;

FIG. 1a shows a perspective view of an exemplary embodiment of the outer electrode;

FIG. 1b shows a schematic cross-sectional view of a piezo-stack, which can be coupled to the outer electrode according to FIG. 1a;

FIG. 2 shows a front view of a first exemplary embodiment of the multilayer actuator;

FIG. 3 shows a side view of the first exemplary embodiment of the multilayer actuator according to FIG. 2;

FIG. 9a shows a perspective view of a fifth exemplary embodiment of the multilayer actuator, which shows the outer electrode according to FIG. 8; and FIG. 9b shows a perspective view of the fifth exemplary embodiment of the multilayer actuator rotated 90° in accordance with FIG. 9a.

In the figures in the drawings, the same reference characters refer to the same or functionally comparable components and units unless otherwise stated.

DETAILED DESCRIPTION

Figure 4:
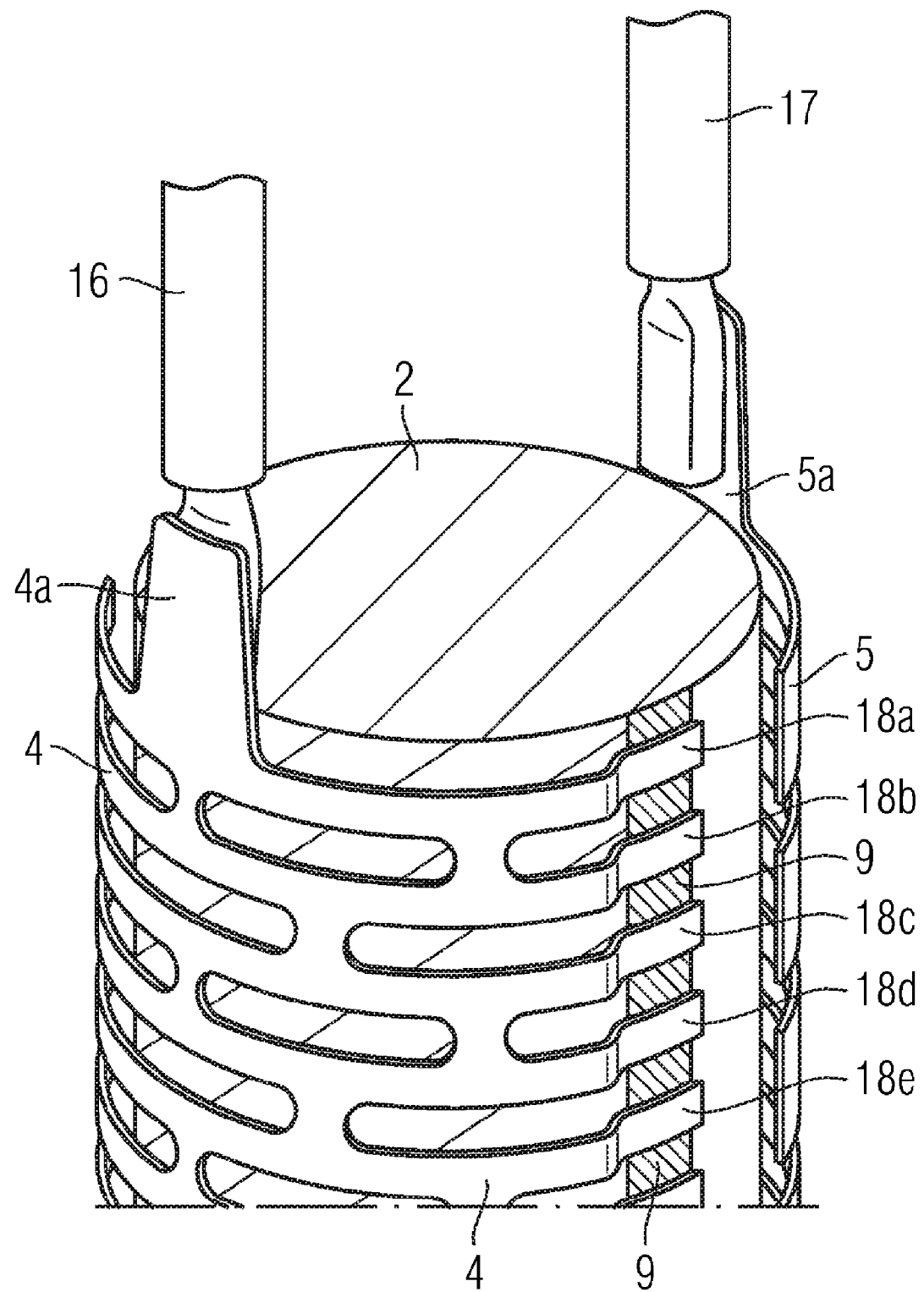
FIG. 4 shows a perspective view of the first exemplary embodiment of the multilayer actuator according to FIGS. 2 and 3.

According to various embodiments, a piezoceramic multilayer actuator with a piezo-stack may have a plurality N of piezo layers, with at least one expandable outer electrode providing at least two current paths between a supply potential connecting area of the outer electrode and an inner electrode with which the outer electrode makes contact, of the piezo-stack.

This means, even in the case of a local interruption between a random inner electrode and the corresponding outer electrode and/or an interruption between this inner electrode and an inner electrode adjacent to this inner electrode, that at least one other current path advantageously exists between this inner electrode and the corresponding outer electrode. The other current path may run directly between this inner electrode and the supply potential connecting area of the outer electrode or via the metallization and another inner electrode to the supply potential connecting area. This means that said inner electrode, which would be affected by the interruption or the interruptions, is also supplied with electrical current so that the corresponding piezo layer, which is actuated by means of said inner electrode, remains operable in an advantageous manner. In the sense of this application, interruption means an area across which an electrical current can no longer flow, in particular due to a mechanical overstressing or a crack in the material.

The embodiment of the outer electrode in accordance with an embodiment thus provides a redundancy facility for a redundant supply of the inner electrodes to be contacted with electric current. For this reason, even in the case of a local interruption of the outer electrode it is ensured that the piezo-stack suffers no losses in electrical capacity or in operable piezo layers.

In addition, the outer electrode in accordance with an embodiment is embodied in such a way that it can expand so that it also has the ability to take part in any movements of the piezo-stack, in particular its longitudinal movements. The expansion capacity and the movement of the outer electrode ensures that only minimal or no tensile or shear stresses can occur at the outer electrode. This means that the probability of a mechanically negative influencing or destruction of the outer electrode is minimized. The probability of an interruption of the outer electrode is thus also minimized.

In accordance with an embodiment, the piezo-stack has a circular cylindrical shape. Usually after having used cylindrical multilayer actuators or piezoactuators it is possible, by using the cylindrical piezo-stack, that the distance between the peripheral surface of the piezo-stack in a cross-sectional plane essentially equals the outer peripheral surface of the multilayer actuator everywhere. Because of this, the space within the multilayer actuator may be utilized better than is the case with conventional angular piezo-stacks. The cylindrical piezo-stack is for example produced by cutting it out of a fully stacked and pressed piezo block using a crown drill.

In accordance with a further embodiment, the outer electrode essentially has a flat shape adapted to a peripheral surface of the piezo-stack and at least partly surrounds the piezo-stack. The flat shape of the outer electrode has the advantage that the volume of the outer electrode is very large and therefore the current carrying capacity of the outer electrode is very high. By adapting the flat outer electrode to the peripheral surface of the piezo-stack, the volume of the outer electrode is clearly enlarged or maximized and the current carrying capacity of the outer electrode clearly increased further without an increase in the thickness of the outer electrode and for this reason without a limitation of the compactness of the multilayer actuator. The outer electrode may essentially be preferably embodied as a flat expanded metal or a perforated sheet or a wire netting for example of Invar or bourdon tube adapted to the peripheral surface of the piezo-stack.

In accordance with a further embodiment, the outer electrode spans an area ranging from 30% to 50%, preferably from 40% to 49%, particularly preferably from 45% to 49% of half the circumference of the piezo-stack.

In accordance with a further embodiment, the piezo-stack has a plurality N of first inner electrodes and a plurality N of second inner electrodes, with a piezo layer being arranged between a first inner electrode and a second inner electrode and the plurality N of first inner electrodes being electrically coupled to a first outer electrode and the plurality N of second inner electrodes to a second outer electrode.

In accordance with a further embodiment, the first outer electrode and the second outer electrode essentially span the piezo-stack, with the first outer electrode being connected to and in particular electrically contacted with a first metallization, which electrically contacts the N first inner electrodes and the second outer electrode with a second metallization, which electrically contacts the N second inner electrodes. The fact that the first outer electrode and the second outer electrode essentially span the piezo-stack, results in an increased volume for the first outer electrode and the second outer electrode without an increase in the thickness of the outer electrodes and without having to accept a limitation of the compactness of the multilayer actuator. An increase in the volume of the outer electrodes advantageously leads to an increased current carrying capacity of this outer electrode.

In accordance with a further embodiment, the outer electrode comprises the following:

the supply potential connecting area;
a plurality of N fingers, which are electronically contacted parallel to the metallization in the area of an inner electrode in each case;
a plurality N of contact links arranged in parallel in the axial direction of the piezo-stack, which span the piezo-stack in the circumferential direction and show a first distance to the piezo-stack, with two adjacent contact links being separated in each case from each other by means of at least one slot arranged in the circumferential direction in order to increase the expansion capacity of the outer electrode and being connected to each other by means of at least one bridge section arranged in the longitudinal direction of the piezo-stack for conveying the current;
a plurality N of connecting sections arranged in the transverse direction of the piezo-stack, with one connecting section in each case electrically connecting one specific finger to the corresponding contact link.

In this process, the slots adjacent to one another in the longitudinal direction are arranged offset from one another in the circumferential direction in a preferred manner.

In accordance with a further embodiment, the outer electrode comprises the following:

the supply potential connecting area;
a first serpentine section arranged in a longitudinal direction of the piezo-stack, which is electrically coupled to the supply potential connecting area and which features a plurality N/2 of first curve sections;
a second serpentine section arranged parallel to the first serpentine section, which is electrically coupled to the supply potential connecting area and which features a plurality N/2 of second curve sections; and
a plurality of N fingers, which are electrically contacted parallel to the metallization in each case in the area of an inner electrode and which are electrically coupled in an alternating manner to the first serpentine section or to the second serpentine section.

In accordance with a further embodiment, each (2n)th finger, with $n \in [1, \ldots, N]$, is connected to the specific first curve section and each (2n+1)th finger to the specific second curve section.

In accordance with a further embodiment, each finger is connected in the area of a vertex of the corresponding curve section to the corresponding curve section.

Because of the alternating connecting of the fingers to the first serpentine section or the second serpentine section, an optimum expansion capacity of the outer electrode is provided. Overall, the configuration of the alternating connecting provides for an optimum compromise between the expansion capacity, the pressure transmission capacity, and the redundancy capacity of the outer electrode.

In accordance with a further embodiment, the first outer electrode is connected to the first metallization by means of a welded joint or by means of at least one bonding wire and/or the second outer electrode to the second metallization by means of a welded joint or by means of at least one bonding wire. As an alternative, it is also feasible to embody the first outer electrode and the first metallization and/or the second outer electrode and the second metallization as a single piece.

In accordance with a further embodiment, the piezo-stack has a first recess in the peripheral surface of the piezo-stack in which the first metallization is arranged, and/or the piezo-stack has a second recess in the peripheral surface of the piezo-stack in which the second metallization is arranged. The first recess may be preferably deep enough for the first metallization to run in such a way within the space determined by the radius of the cylindrical piezo-stack and/or the second recess that the second metallization runs within the space determined by the radius of the cylindrical piezo-stack. Because of this arrangement of the metallization in accordance with various embodiments within the space determined by the radius of the cylindrical piezo-stack, space is saved which leads to an improved compact type of construction of the multilayer actuator.

In accordance with a further embodiment, provision has been made for a sleeve enveloping at least the piezo-stack, the first outer electrode and the second outer electrode. The sleeve can be preferably embodied as a corrugated tube which features a plurality of M corrugations and is in particular metallic. The outer electrode which can expand is in particular suitable for recording a first relative movement between the sleeve and the outer electrode and a second relative movement between the outer electrode and the piezo-stack. By recording the relative movements, it is possible according to an embodiment for the sleeve as well as the outer electrodes to take part in any movements of the piezo-stack. Because of the corrugated tube-like embodiment of the sleeve, it is possible in an advantageous manner to improve the recording of the relative movements. The corrugated tube is in particular metallic and makes it possible in an advantageous manner, in the case of an inevitable electrical conductivity of commercial fuels, to protect the piezoceramic multilayer actuator against voltage flashovers. The first outer electrode and the second outer electrode are suitable for transmitting a pressure on the outside of the sleeve to the piezo-stack in an advantageous manner. This supports the expansion capacity of the piezo-stack in an advantageous manner and as a result improves the operability of the piezoceramic multilayer actuator.

In accordance with a further embodiment, provision has been made for a first passivation layer between the piezo-stack and the outer electrodes and a second passivation layer between the outer electrodes and the sleeve. The first passivation layer and the second passivation layer in particular in each case embody a passivating envelope for the first outer electrode and the second outer electrode. As a result, a voltage flashover between the piezo-stack and the outer electrode as well as any units or elements arranged outside the outer electrode such as for example the sleeve is thus avoided in an advantageous manner.

In accordance with a further embodiment, the first passivation layer and/or the second passivation layer essentially consists of an elastomer, in particular Teflon, or a gel. Because of the coating with the elastomer or the enveloping in the gel, the friction is advantageously reduced or minimized with the transmission of the outer pressure applied to the piezo-stack. A reduced or a minimal friction leads to a minimal energy loss with the transmission and the distribution of the pressure applied to the outside of the multilayer actuator.

In accordance with a further development, provision has been made for at least one O-ring shaped supporting element in at least one corrugation of the corrugated tube, which in particular consists of an elastomer, for example Teflon. The O-ring shaped supporting element supports the mechanical stability of the corrugated tube and in this way contributes to an increased service life of the multilayer-actuator. The O-ring shaped supporting element is advantageously coated with an elastomer so that only reduced or minimal friction losses occur.

In accordance with a further embodiment, the corrugated tube is embodied as a longitudinal corrugated tube and/or a corrugated tube which can expand in a transverse direction.

In accordance with a further embodiment, the multilayer actuator is embodied in a circular cylindrical shape.

In accordance with a further embodiment, the first passivation layer and/or the second passivation layer has a Shore A hardness of at least 70.

In accordance with a further embodiment, provision has been made that each outer electrode has a connection, which contacts the supply potential connecting area of the outer electrode for supplying the corresponding inner electrode with a supply potential.

The exemplary embodiments of the piezoceramic multilayer actuator 1 explained below have in common that at least one outer electrode 4, 5, which contacts the relevant inner electrodes with a plus pole or a minus pole of a supply voltage source, is designed in such a way that it can expand and provides at least two current paths between a supply potential connecting area 4a, 5a of the outer electrode 4, 5 and at least one inner electrode 6, 7, with which the outer electrode 4, 5 makes contact, of the piezo-stack 2.

FIG. 1 provides a perspective view of an exemplary embodiment of the outer electrode 4. The outer electrode 4, according to FIG. 1a, shows in the areas that extend laterally from it, fingers 18a-18f to contact the piezo-stack 2 in a preferred manner.

FIG. 1b shows a schematic cross-sectional view of a piezo-stack 2, which can be coupled to the outer electrode 4 according to FIG. 1a. The piezo-stack 2 preferably features a plurality N of first inner electrodes 6 and a plurality N of second inner electrodes 7. In this case, a piezo layer 3 is arranged between a first inner electrode 6 and a second inner electrode 7. The plurality N of the first inner electrodes 6 must be coupled via a first metallization 9 to a first outer electrode 4 in accordance with FIG. 1a. The plurality N of the second inner electrodes 7 must be coupled via a second metallization 10 to a second outer electrode 5 (not shown in FIGS. 1a and 1b). The electrical coupling of the first outer electrode 4 in accordance with FIG. 1a with the first metallization 9, to which the first inner electrodes 6 are connected, is shown by broken lines between FIGS. 1a and 1b in segments.

The outer electrode 4 in accordance with an embodiment may preferably feature a plurality of fingers 18a-18f. One finger in particular, for example the finger 18a, is connected to the first metallization 9 in the area of an inner electrode 6. The two different current paths 11 and 12 between this inner electrode 6 and the supply potential connecting area 4a of the outer electrode 4 for example exist between the inner electrode 6, which is connected to the finger 18a. The supply potential connecting area 4a can be coupled to a connection 16 (see FIG. 2). By means of the connection, the outer electrode 4 as well as the first inner electrodes 6 coupled to the outer electrode 4 can be connected to a predetermined supply potential. Should the outer electrode 4 in the area 23 for example become interrupted, then indeed the first current path I1, but not the second current path I2 would be interrupted. In addition, a plurality of other current paths are obtained for the top-most inner electrode 6 in accordance with FIG. 1b via the first metallization 9 and the fingers 18b-18f of the first outer electrode 4 are coupled to the first metallization 9. The same applies to all further inner electrodes 6.

The outer electrode 4 may preferably feature the supply potential connecting area 4a, a plurality N of fingers 18a-18f, a plurality N of contact links 24a-24f and a plurality N of connecting sections 27a-27f. The N fingers 18a-18f are in each case electronically contacted parallel to the metallization 9 preferably in the area of an inner electrode 6a-6e. The plurality N of contact links 24a-24f are arranged in parallel in the axial direction of the piezo-stack 2. The N contact links 24a-24f span the piezo-stack in the circumferential direction and show a predetermined distance Δ1 to the piezo-stack 2 (see FIG. 3). In each case, two adjacent contact links 24a-24f are separated from each other by means of at least one slot 25a-25r arranged in the circumferential direction of the piezo-stack 2 in order to increase the expansion capacity of the outer electrode 4 and are connected to each other by means of at least one bridge section 26a-26n arranged in the longitudinal direction of the piezo-stack 2 for conveying the current. The N connecting sections 27a-27f are arranged in the transverse direction of the piezo-stack 2, with one connecting section 27a-27f in each case electrically connecting one specific finger 28a-28e to the corresponding contact link 24a-24f.

In this process, the slots adjacent to one another in the longitudinal direction may be preferably arranged offset from one another in the circumferential direction.

FIGS. 2 and 3 show a front view or a side view of a first exemplary embodiment of the multilayer actuator 1. The first outer electrode 4 and the second outer electrode 5 essentially span the piezo-stack 2. The first electrode 4 is coupled to the first connection 16 and the second electrode 5 is coupled to a second connection 17. The first connection 16 is coupled to and in particular contacted with the supply potential connecting area 4a of the first outer electrode 4 for supplying the first inner electrodes 6 with a first supply potential. The second connection 17 is contacted with a supply potential connecting area 5a of the second outer electrode 5 for supplying the second inner electrodes 7 with a second supply potential.

For example, the first connection 16 is connected to a plus pole of a supply voltage (not shown) and the second connection 17 to a minus pole of the supply voltage. Then the first electrodes 6 would for example be connected to a positive supply potential and the second inner electrodes 7 to a negative supply potential. The potential difference or voltage, which is obtained from the difference between the first supply potential and the second supply potential, serves to actuate the piezo layers 3.

FIG. 4 shows a perspective view of the first exemplary embodiment of the multilayer actuator 1 according to FIGS. 2 and 3. The specific outer electrode 4, 5 is contacted by means of its fingers 18a-18e to the specific metallization 9, 10 in a preferred manner. The first outer electrode 4 with the first metallization 9 is connected by means of a welded joint or by means of at least one bonding wire (not shown) and/or the second outer electrode 5 with the second metallization 10 is connected by means of a welded joint or by means of at least one bonding wire in a preferred manner. As an alternative, the first outer electrode 4 and the first metallization 9 and/or the second outer electrode 5 and the second metallization 10 can also be embodied as a single piece.

Figure 5:
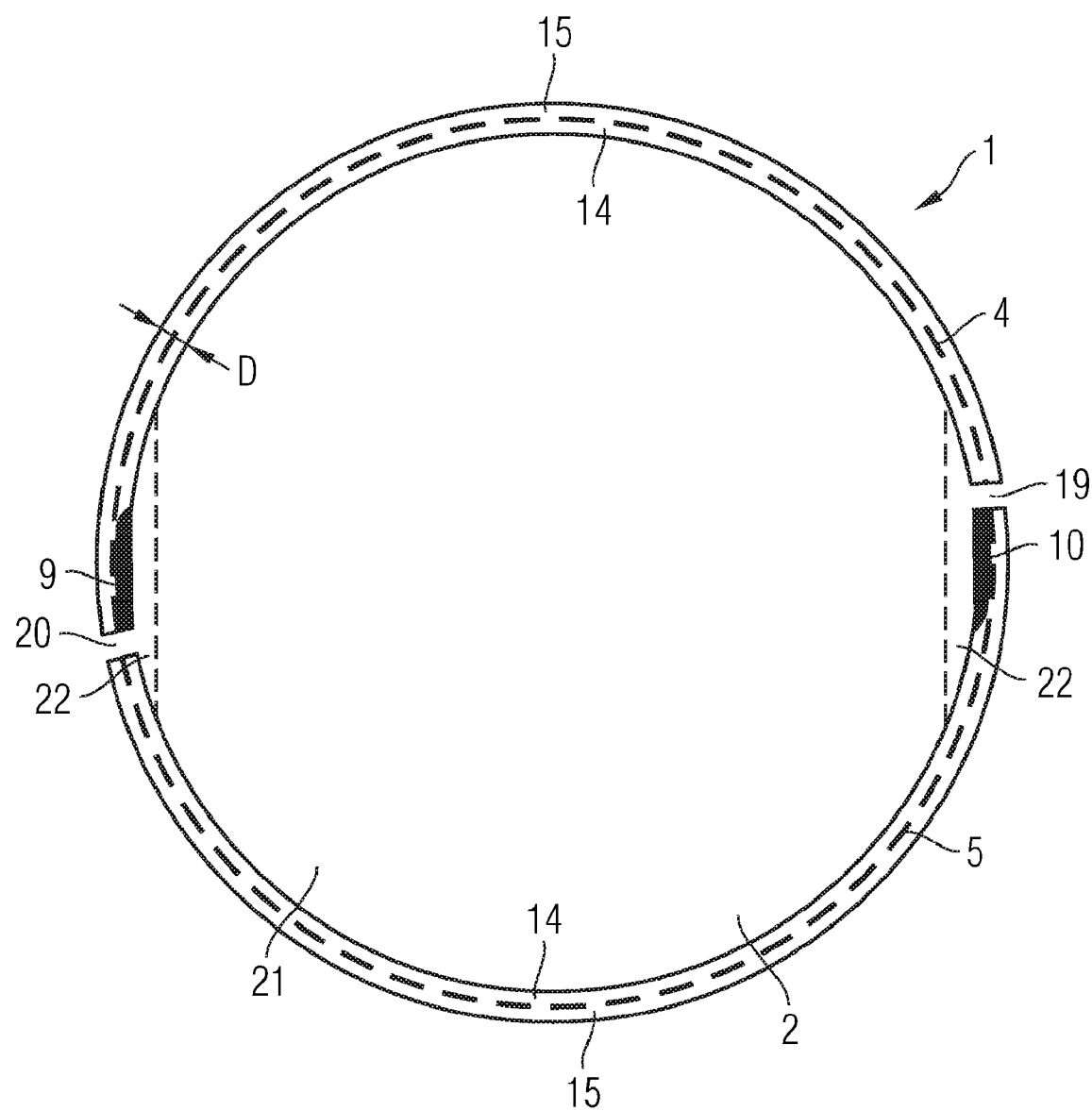
FIG. 5 shows a schematic cross-sectional view of a second exemplary embodiment of the multilayer actuator.

FIG. 5 shows a schematic cross-sectional view of a second exemplary embodiment of the piezoceramic multilayer actuator 1. The piezo-stack 2 of the multilayer actuator 1 in each case shows a piezo active area 21 and at two opposite peripheral areas, a piezo passive area 22. Provision may preferably be made for a metallization 9, 10 within the piezo passive area 22. The first outer electrode 4 is electrically coupled to the first metallization 9 in order to actuate the first inner electrodes 6. The second outer electrode 5 is electrically coupled to the second metallization 10 in order to actuate the second electrodes 7.

A first passivation layer 14 may preferably be arranged between the piezo-stack 2 and the outer electrodes 4, 5. In addition, a second passivation layer 15 is arranged over the outer electrodes 4, 5. The passivation layers 14, 15 in each case show a passivation sheath for the first outer electrode 4 and for the second outer electrode 5. The first passivation layer 14 and/or the second passivation layer 15 has a Shore A hardness of at least 70 in a preferred manner. The outer electrodes 4, 5 passivated with the passivation layers 14, 15, preferably may form a transmission means which transmits a pressure applied on the outside of the multilayer actuator to the piezo-stack 2 and has a thickness D of 10 µm-1000 µm, preferably 100 µm-200 µm. The first outer electrode 4 is electrically uncoupled from the second metallization 10 by means of a first separating area 19. The second outer electrode 5 is electrically uncoupled from the first metallization 9 by means of a second separating area 20. The piezo-stack 2 may have preferably a circular cylindrical shape.

Figure 6:
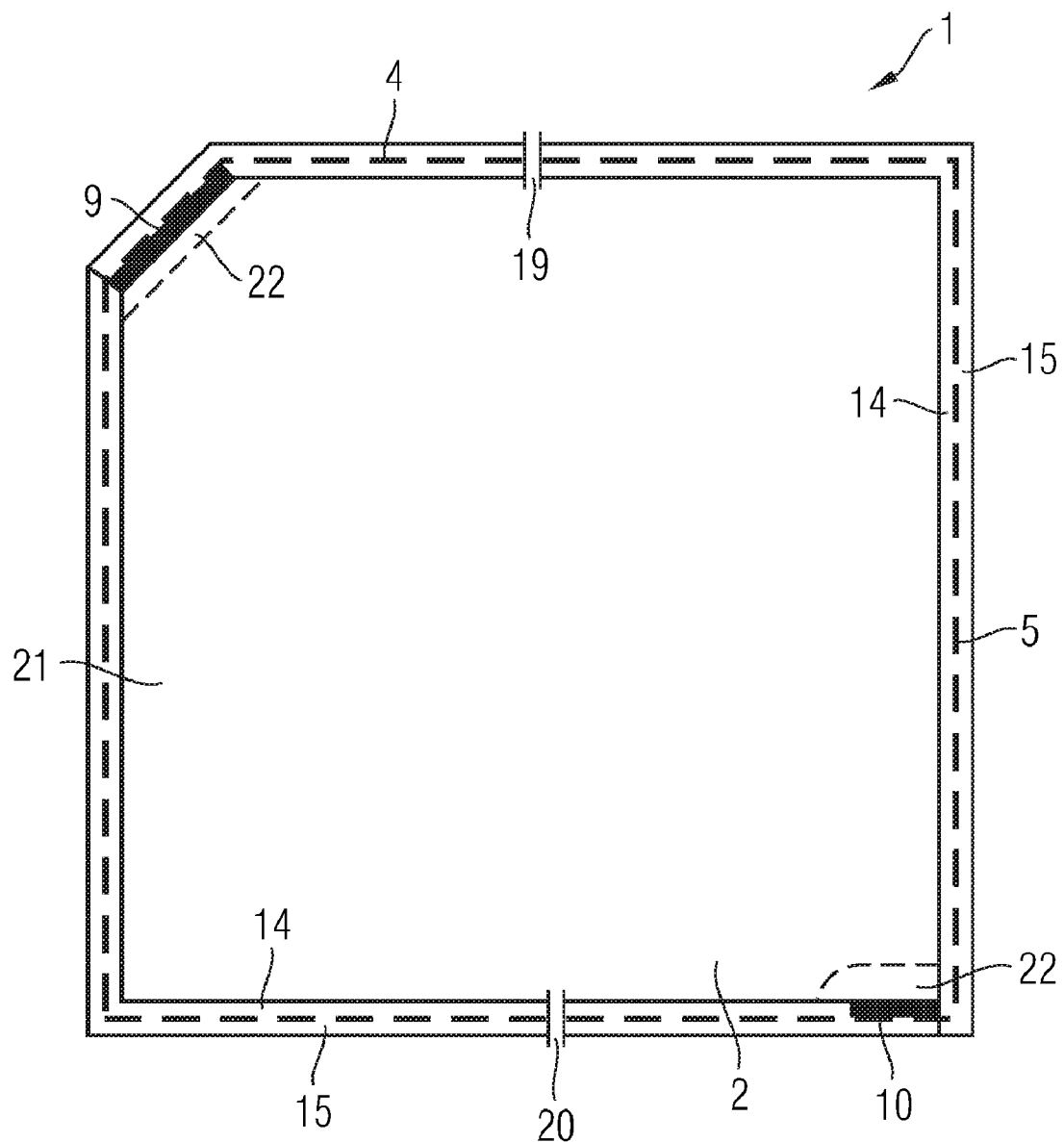
FIG. 6 shows a schematic cross-sectional view of a third exemplary embodiment of the multilayer actuator.

FIG. 6 shows a schematic cross-sectional view of a third exemplary embodiment of the multilayer actuator 1. The third exemplary embodiment in accordance with FIG. 6, distinguishes itself from the second exemplary embodiment in accordance with FIG. 5 to the effect that the piezo-stack 2 is not a circular cylindrical shape, but essentially is shaped like a square. Two different embodiments of the piezo passive area 22 are for example shown.

Figure 7:
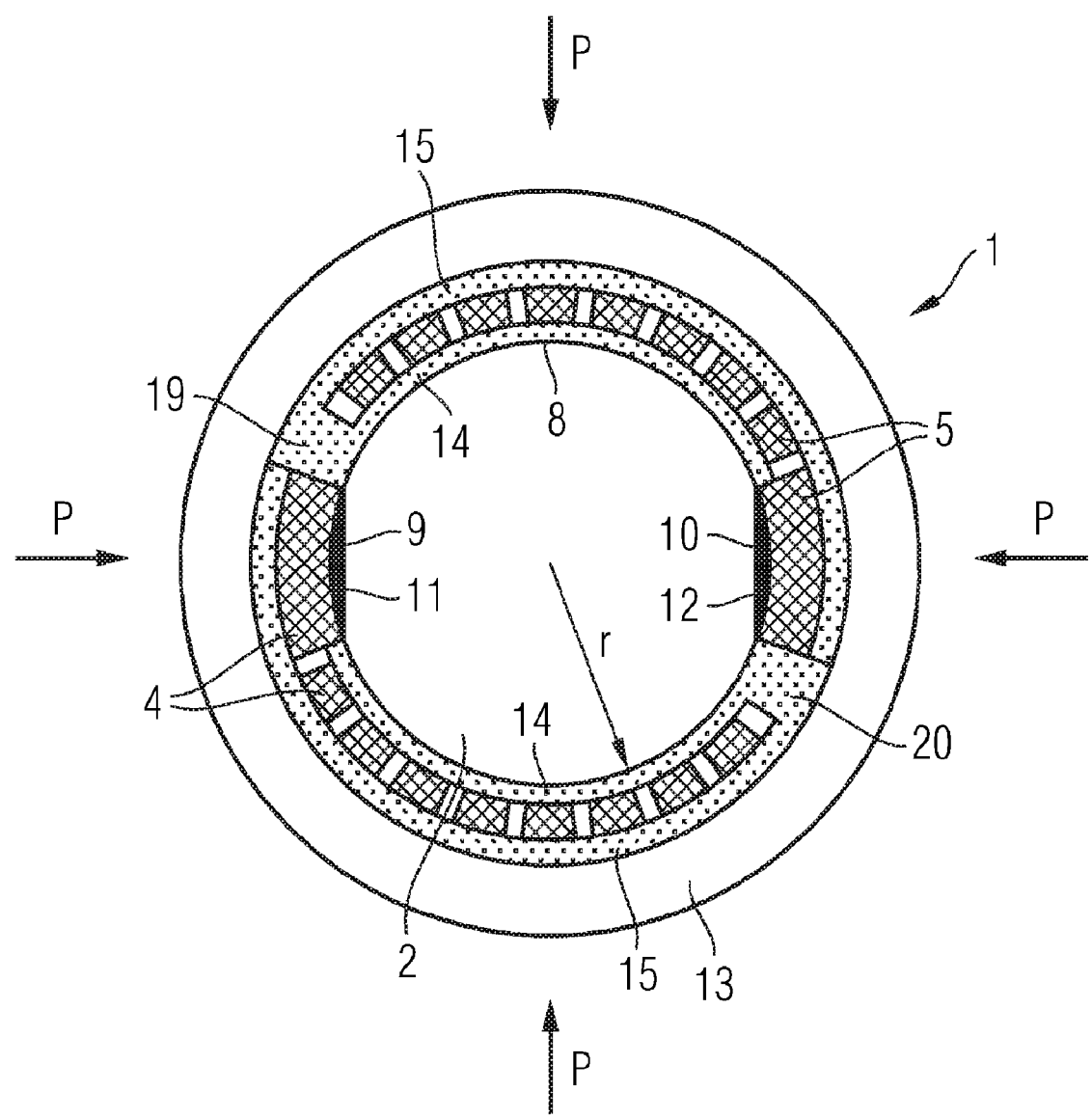
FIG. 7 shows a schematic cross-sectional view of a fourth exemplary embodiment of the multilayer actuator.

FIG. 7 shows a schematic cross-sectional view of a fourth exemplary embodiment of the piezoceramic multilayer actuator 1. The fourth exemplary embodiment in accordance with FIG. 7 essentially corresponds to the second exemplary embodiment in accordance with FIG. 5. Furthermore, provision has been made for a sleeve 13 in the fourth exemplary embodiment in accordance with FIG. 7, which encloses at least the piezo-stack 2, the first outer electrode 4, and the second outer electrode 5. Furthermore, the sleeve 13 also encloses the first passivation layer 14 and the second passivation layer 15, that form two passivation sheathes for the first outer electrode 4 and the second outer electrode 5.

The piezo-stack 2 preferably may have a first recess 11 in the peripheral surface 8 of the piezo-stack 2 in which the first metallization 9 is arranged. In addition, the piezo-stack 2 in particular has a second recess 12 in the peripheral surface 8 of the piezo-stack 2 in which the second metallization 10 is arranged.

The first recess 11 is in particular deep enough for the first metallization 9 to run within the space determined by the radius r of the cylindrical piezo-stack 2 and/or the second recess 12 for the second metallization 10 to run within the space determined by the radius r of the cylindrical piezo-stack 2.

The sleeve 13 is for example embodied as a corrugated tube which shows a plurality of M corrugations and is in particular metallic. In addition, provision may be made for preferably at least one O-ring shaped supporting element in at least one corrugation of the corrugated tube 13, which in particular consists of an elastomer, for example Teflon. The corrugated tube 13 can preferably expand in a longitudinal direction or in a transverse direction. All told, the multilayer actuator 1 in particular has a circular cylindrical shape.

The first outer electrode 4 and the second outer electrode 5 are in particular suited for transmitting a pressure P applied on the outside to the sleeve in order to improve the expansion capacity of the piezo-stack 2 to the piezo-stack 2.

Figure 8:
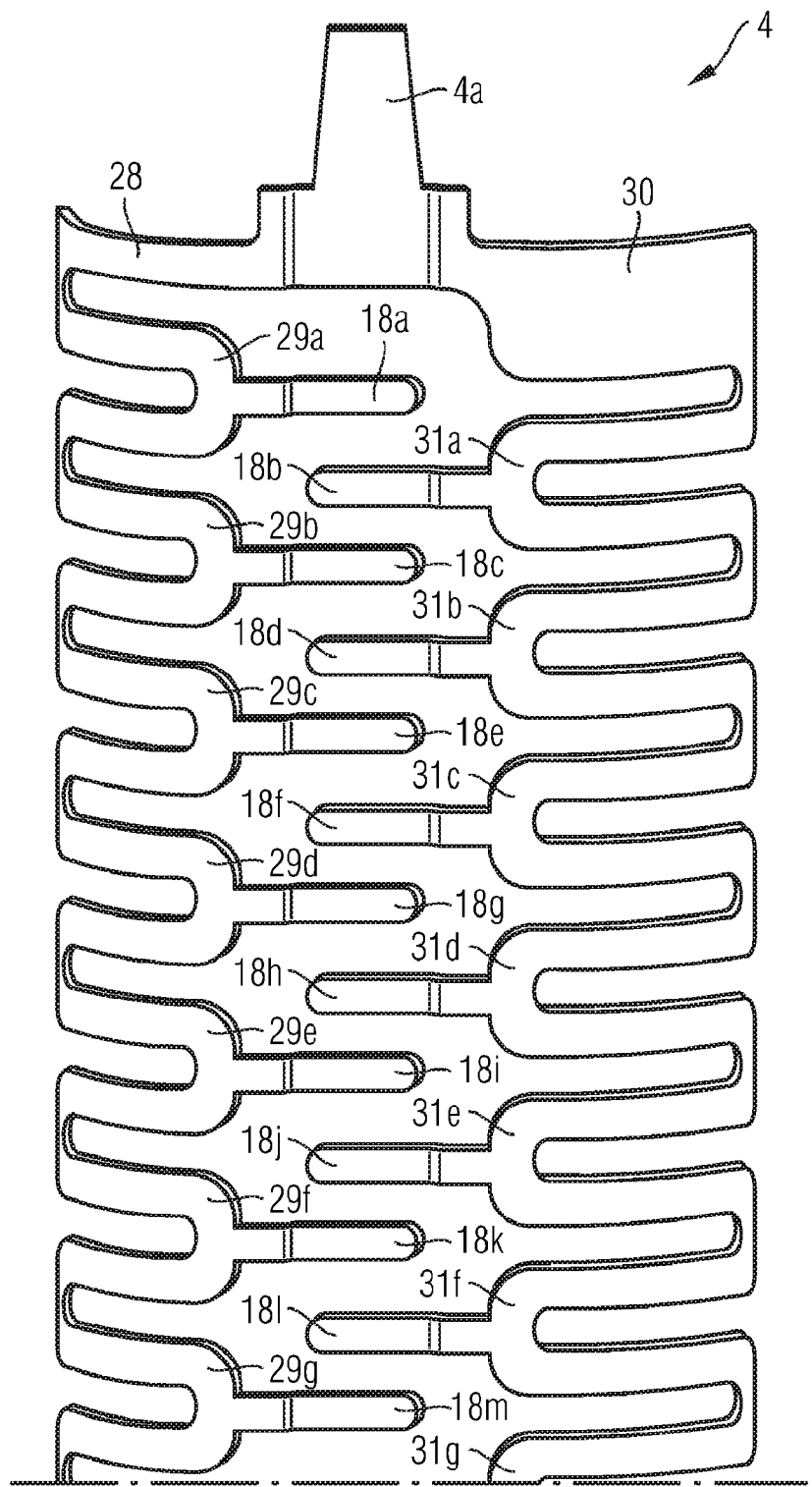
FIG. 8 shows a perspective view of a further exemplary embodiment of the outer electrode.

FIG. 8 shows a perspective view of a further exemplary embodiment of the outer electrode 4. The outer electrode 4 shows the supply potential connecting area 4a, a first serpentine section 28, a second serpentine section 30, and a plurality of N fingers 18a-18m in a preferred manner. The first serpentine section 28 is arranged in the longitudinal direction of the piezo-stack 2. The first serpentine section 28 is electrically coupled to the supply potential connecting area 4a and shows a plurality N/2 of first curve sections 29a-29g. The second serpentine section 30 is arranged parallel to the first serpentine section 28. The second serpentine section 30 is electrically coupled to the supply potential connecting area 4a, connected in particular. The second serpentine section 30 shows a plurality N/2 of second curve sections 31a-31g. The N fingers 18a-18m are in each case electrically contacted in parallel on the metallization 9 in the area of an inner electrode 6a-6e and are electrically coupled in an alternating manner to the first serpentine section 28 or the second serpentine section 30. In particular the supply potential connecting area 4a, the first serpentine section 28, the second serpentine section 30 as well as the plurality N of fingers 18a-18m are embodied as a single piece for the embodiment of the outer electrode 4.

Each (2n)th finger 18a, 18c, 18e, 18g, 18i, 18k, 18m, with n ∈ [1, . . . , N], is connected to the specific first curve section 29a-29g and each (2n+1)th finger 18b, 18d, 18f, 18h, 18j, 18l to the specific curve section 31a-31g in a preferred manner.

Each finger 18a-18m in the area of a vertex of the corresponding curve section 29a-29g; 31a-31g is in particular connected to the corresponding curve section 29a-29g; 31a-31g.

FIG. 9a shows a perspective view of a fifth exemplary embodiment of the multilayer actuator 1, which has the outer design 4 as well as an outer electrode 5 that has a construction similar to that of the outer electrode 4. FIG. 9a shows that the first outer electrode 4 and the second outer electrode 5, essentially span the piezo-stack 2. In this process, the specific outer electrode 4, 5 spans an area ranging from 30% to 50%, preferably from 40% to 49%, particularly preferred from 45% to 49% of half the circumference of the piezo-stack 2. The first outer electrode 4 and the second outer electrode 5 are, on each side, at a distance from one another by a second distance Δ2.

FIG. 9b shows a perspective view of the fifth exemplary embodiment of the multilayer actuator 1 rotated 90° in accordance with FIG. 9a. In this case, only the first outer electrode 4 can be seen, however not the second outer electrode 5. The first outer electrode 4 is electrically coupled via its fingers 18e, 18d (for reasons of clarity only these two fingers were provided with reference symbols) to the first metallization 9.

The method for producing a piezoceramic multilayer actuator 1 is explained below. The method in accordance with an embodiment has the following process steps a and b:

Process Step a:
A piezo-stack 2 is provided, which has a plurality N of piezo layers 3.

Process Step b:
At least one outer electrode 4, 5 which can expand is arranged at the piezo-stack 2, with the outer electrode 4, 5 providing at least two current paths I1, I2 between a supply potential connecting area 4a, 5a of the outer electrode 4, 5 and a respective inner electrode 6, 7 of the piezo-stack 2, with which the outer electrode 4, 5 makes contact.

The piezoceramic multilayer actuator 1 in accordance with various embodiments can be used in an injection system of a motor vehicle in a preferred manner. In this process, the multilayer actuator 1 is in particular arranged in the high-pressure space of the injection system. The injection system is embodied as a common rail injection system in a preferred manner.

Although this invention was described with reference to the exemplary embodiments, said invention is not limited to the exemplary embodiments described above, but can be modified in many ways. The multilayer actuator and in this way in particular also the piezo-stack and the outer electrode can for example have a rectangular cross-sectional shape and/or also any cross-sectional shape.

The invention claimed is:

1. A piezoceramic multilayer actuator comprising a piezo-stack, which has a plurality N of piezo layers having at least one expandable outer electrode which provides at least two current paths between a supply potential connecting area of the outer electrode and a respective inner electrode of the piezo-stack with which the outer electrode makes contact, wherein the piezo-stack has a plurality N of first inner electrodes and a plurality N of second inner electrodes, with a piezo layer being arranged between a first inner electrode and a second inner electrode and the plurality N of first inner electrodes being electrically coupled to a first outer electrode and the plurality N of second inner electrodes to a second outer electrode, wherein, the first outer electrode and the second outer electrode essentially span the piezo-stack, with the first outer electrode being connected to a first metallization, which electrically contacts the N first inner electrodes and the second outer electrode to a second metallization, which electrically contacts the N second inner electrodes, wherein the outer electrode comprises:
   the supply potential connecting area;
   a plurality of N fingers, which are electronically contacted parallel to the metallization in the area of an inner electrode in each case;
   a plurality N of contact links arranged in parallel in the axial direction of the piezo-stack, which span the piezo-stack in the circumferential direction and feature a first distance to the piezo-stack, with two adjacent contact links in each case being separated from each other by means of at least one slot arranged in the circumferential direction in order to increase the expansion capacity of the outer electrode and being connected to each other by means of at least one bridge section arranged in the longitudinal direction of the piezo-stack for conveying the current;
   a plurality N of connecting sections arranged in the transverse direction of the piezo-stack, with one connecting section in each case electrically connecting one specific finger to the corresponding contact link.

2. The multilayer actuator according to claim 1, wherein, the piezo-stack has a circular cylindrical shape.

3. The multilayer actuator according to claim 1, wherein the outer electrode essentially has a flat shape adapted to a peripheral surface of the piezo-stack and at least partly surrounds the piezo-stack.

4. The multilayer actuator according to claim 1, wherein the outer electrode is essentially embodied as one of selected from the group consisting of: a flat expanded metal, a perforated sheet, a wire mesh, and a bourdon tube.

5. The multilayer actuator according to claim 1, wherein, the outer electrode spans an area ranging from 30% to 50% or from 40% to 49%, or from 45% to 49% of half the circumference of the piezo-stack.

6. The multilayer actuator according to claim 1, wherein the first outer electrode with the first metallization is connected by means of a welded joint.

7. The multilayer actuator according to claim 1, wherein the first outer electrode and the first metallization are embodied as a single piece.

8. The multilayer actuator according to claim 1, wherein the first outer electrode with the first metallization is connected by means of at least one bonding wire.

9. The multilayer actuator according to claim 1, wherein the multilayer actuator has a circular cylindrical shape.

10. The multilayer actuator according to claim 1, wherein, provision has been made for a connection, which contacts the supply potential connecting area of the outer electrode for supplying the corresponding inner electrode with a supply potential.

11. The multilayer actuator according to claim 1, wherein the slots adjacent to one another in the longitudinal direction are arranged offset from one another in the circumferential direction.

12. A method for producing a piezoceramic multilayer actuator, comprising the steps of:
   (a) providing a piezo-stack which has a plurality N of piezo layers, wherein the piezo-stack has a plurality N of first inner electrodes and a plurality N of second inner electrodes, arranging a piezo layer between a first inner electrode and a second inner electrode and electrically coupling the plurality N of first inner electrodes to a first outer electrode and the plurality N of second inner electrodes to a second outer electrode, wherein, the first outer electrode and the second outer electrode essentially span the piezo-stack, and connecting the first outer electrode to a first metallization, which electrically contacts the N first inner electrodes and the second outer electrode to a second metallization, which electrically contacts the N second inner electrodes; and
   (b) arranging at least one outer electrode which can expand on the piezo-stack in such a way that at least two current paths are provided between a supply potential connecting area of the outer electrode and a respective inner electrode, with which the outer electrode makes contact, of the piezo-stack, wherein the outer electrode comprises:
      the supply potential connecting area
      a plurality of N fingers, which are electronically contacted parallel to the metallization in the area of an inner electrode in each case;
      a plurality N of contact links arranged in parallel in the axial direction of the piezo-stack, which span the piezo-stack in the circumferential direction and feature a first distance to the piezo-stack, with two adjacent contact links in each case being separated from each other by means of at least one slot arranged in the circumferential direction in order to increase the expansion capacity of the outer electrode and being connected to each other by means of at least one bridge section arranged in the longitudinal direction of the piezo-stack for conveying the current; and
      a plurality N of connecting sections arranged in the transverse direction of the piezo-stack, with one connecting section in each case electrically connecting one specific finger to the corresponding contact link.

13. The multilayer actuator according to claim 6, wherein the second outer electrode and the second metallization are embodied as a single piece.

14. The multilayer actuator according to claim 1, wherein the second outer electrode with the second metallization is connected by means of a welded joint or by means of at least one bonding wire.

* * * * *